United States Patent [19]

Robins

[11] 4,092,607

[45] May 30, 1978

[54] MAGNETIC AMPLIFIER HAVING A CO-AXIAL WINDING

[75] Inventor: William Harold Robins, Peterborough, Canada

[73] Assignee: Canadian General Electric Co., Ltd., Toronto, Canada

[21] Appl. No.: 750,304

[22] Filed: Dec. 13, 1976

[30] Foreign Application Priority Data

Aug. 19, 1976 Canada .................................. 259482

[51] Int. Cl.² ............................................. H03F 9/00
[52] U.S. Cl. ..................................... 330/8; 336/174; 336/195

[58] Field of Search ......................... 330/8; 323/89 C; 336/173, 174, 180, 195

[56] References Cited

U.S. PATENT DOCUMENTS

| | | | |
|---|---|---|---|
| 2,901,713 | 8/1959 | Hartmann | 336/195 X |
| 3,716,806 | 2/1973 | Zelenz | 336/195 X |

*Primary Examiner*—James B. Mullins
*Attorney, Agent, or Firm*—William Freedman; Carl L. Silverman

[57] ABSTRACT

A magnetic amplifier having a magnetic core in the shape of a hollow cylinder is provided with a gate winding comprising series-connected coaxial conductors passing through the center of the hollow core.

10 Claims, 2 Drawing Figures

MAGNETIC AMPLIFIER HAVING A CO-AXIAL WINDING

BACKGROUND

This invention relates to magnetic amplifiers and more particularly to a particular construction for the gate winding of a magnetic amplifier.

Magnetic amplifiers have found use in electrical systems requiring relatively large power gains and isolation between the control circuitry and the output or load circuitry. For example, in high power distribution systems large magnetic amplifiers are commonly used for varying or regulating the magnitude of large amounts of power.

The term "magnetic amplifier" has been broadly applied to any static device employing saturable core reactors to provide amplification or control. The saturable core reactors employed in magnetic amplifier circuits generally have a core formed of magnetic material having a substantially rectangular dynamic hysteresis curve, i.e., the plot of flux density (B) against magnetizing force (H). When such core materials are used, the core of the reactor can be made to change from saturation in one direction to saturation in the opposite direction in response to a small change in magnetizing force. Saturable core reactors have a further characteristic of displaying very high impedance when their cores are unsaturated and very low impedance when saturated.

A magnetic amplifier in the broadest sense includes a saturable core reactor with its high current winding, referred to as a "gate" winding, connected in series with a load and a source of alternating current. It will thus be readily understood that when the reactor core is unsaturated, so that the reactor displays high impedance, minimum current will flow in the gate winding (and consequently in the load); conversely, when the reactor core is saturated with the reactor displaying low impedance, maximum current will flow in the gate winding. By causing the reactor core to go into saturation at some point during a half-cycle of applied AC voltage, it will be seen that the load current will be small during the first part of the half-cycle and large during the remainder. By varying the point at which the core goes into saturation, referred to as the firing angle, the duration of the impulses of highvalue load current and thus the average value of load current can be varied.

The core of the reactor is conventionally provided with a DC bias or control winding commonly energized from a source of adjustable DC voltage. The bias winding therefore provides a predetermined magnetomotive force (MMF) level in the core. The firing angle of a given core may be varied by providing it with a predetermined MMF (via the bias winding) so that after each half-cycle of applied AC voltage, the core returns to a predetermined point on its dynamic hysteresis curve of B-H characteristics. With the core beginning each half-cycle at a predetermined point on its B-H curve, as established by the bias winding current, the remaining MMF required to drive the core into saturation is provided by the current flowing in the gate winding. Since a small change in the bias voltage will provide a large change in the firing angle and thus the average load current, it is seen that a small control signal can be made to control a large load current.

As the load current, and thus the gate winding currents, increase in magnitude, the magnetic amplifiers become larger and the gate windings in particular become bulky and complicate the construction.

SUMMARY

The present invention modifies the gate winding by employing co-axially mounted conductors. The co-axial conductors are situated in the reactor core, with their axes coincident with the longitudinal axis of the core, and are interconnected at their ends by bus bars which are located externally of the reactor core. The co-axial conductors are interconnected in such a fashion that the current flows in the same direction in each of them.

Stated in another way, the present invention comprises a magnetic amplifier having a hollow cylindrical core, a control winding, and a gate winding: the gate winding is characterized by having a plurality of co-axial conductors passing longitudinally through the core, and insulated therefrom; the co-axial conductors being interconnected, externally of the core, in such a manner that the co-axial conductors form a series circuit such that the currents passing through the co-axial conductors flow in the same direction in all the co-axial conductors.

BRIEF DESCRIPTION OF DRAWINGS

A preferred embodiment of the invention will now be described in more detail with reference to the accompanying drawings in which.

DETAILED DESCRIPTION OF PREFERRED EMBODIMENT

Figure 1:
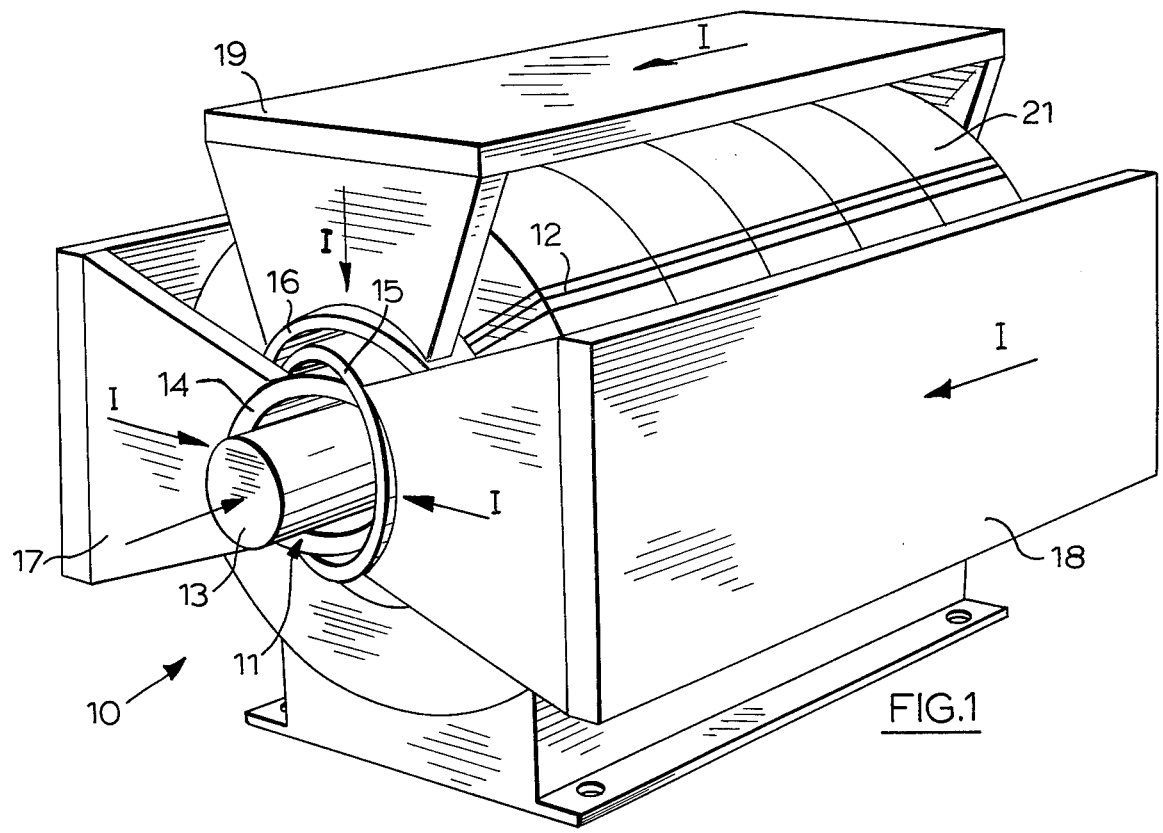
FIG. 1 is a perspective view of a magnetic amplifier incorporating the invention.
Figure 2:
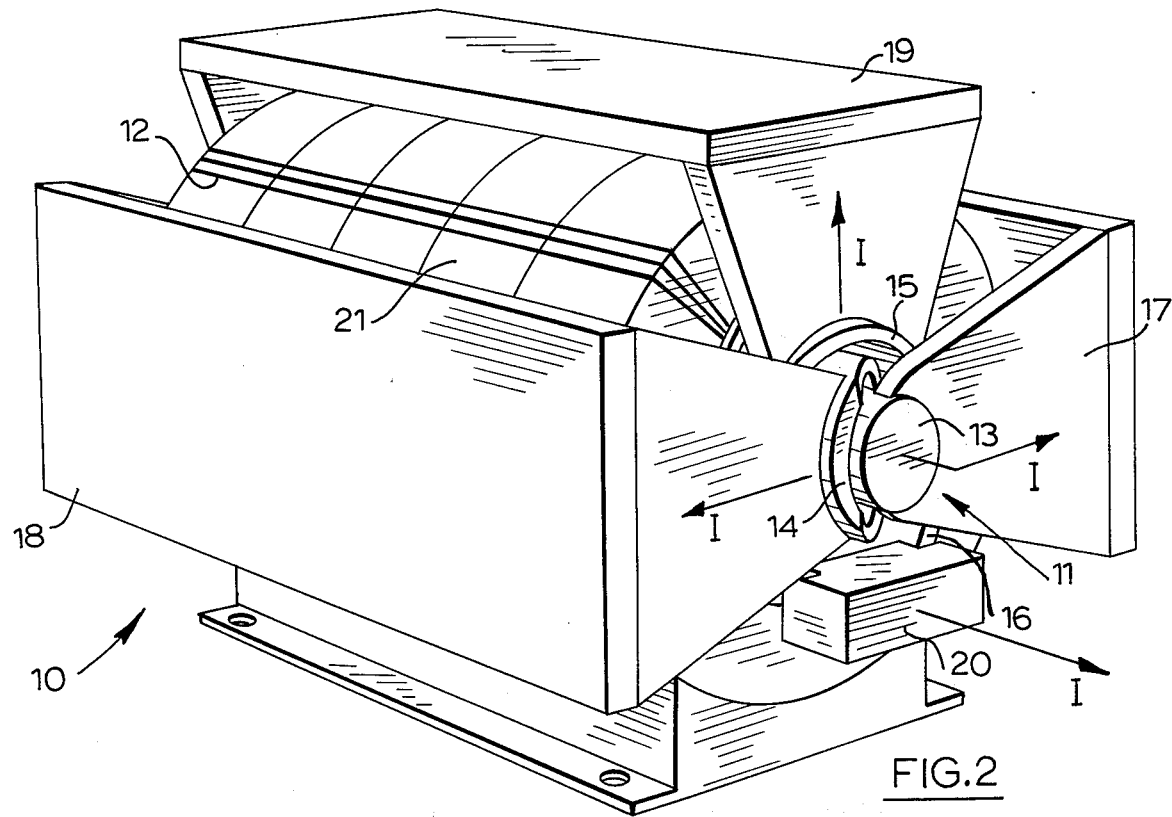
FIG. 2 is a perspective view, similar to FIG. 1, but showing another view.

FIGS. 1 and 2 will be referenced jointly since they are but different views of the same device, and consequently have many components in common. The Figures show a magnetic amplifier indicated generally by the numeral 10. Magnetic amplifier 10 comprises a gate winding indicated generally by the numeral 11, a control winding indicated by the numeral 12, and a core 21.

Control winding 12 provides a predetermined MMF level in the core 21, of amplifier 10, depending upon the magnitude of the DC current flowing in the winding 12. In more detail, control winding 12 comprises approximately 5 to 10 turns of insulated wire wrapped around the core 21. Winding 12 is shown simplified in the Figures.

As can be seen from the Figures, gate winding 11 comprises cylindrical conductors 13, 14, 15 and 16 and return conductors 17, 18 and 19. It can also be seen that core 21 has the general shape of a hollow cylinder. Cylindrical conductor 13 is located inside the hollow portion of core 21 and situated approximately coincident with the longitudinal axis of the core 21. Cylindrical conductor 14 is in the general shape of a hollow cylinder and is situated so that its longitudinal axis is coincident with the longitudinal axis of conductor 13. Similarly conductor 15 is in the general shape of a hollow cylinder and is situated so that its longitudinal axis is coincident with the longitudinal axis of conductor 13. And cylindrical conductor 16 is in the general shape of a hollow cylinder and is situated so that its longitudinal axis is coincident with the longitudinal axis of conductor 13. The conductors 13, 14, 15 and 16 are constructued and positioned so that none of the conductors touch one another. In short, conductors 13, 14, 15 and 16 are co-axial, with conductor 13 at the centre, and the rest of the conductors 14, 15 and 16 as shown in the Figures.

Return conductors 17, 18 and 19 are employed to interconnect the cylindrical conductors 13, 14, 15 and 16 so as to produce a series connection of the conductors 13, 14, 15 and 16 and produce a gate winding 11 in which the currents flowing in conductors 13, 14, 15 and 16 are all in the same direction. Conductor 17 connects the end of cylindrical conductor 13 (shown in FIG. 2) to the end of cylindrical conductor 14 (shown in FIG. 1). Similarly, return conductor 18 connects the end of cylindrical conductor 14 (shown in FIG. 2) to the end of cylindrical conductor 15 (shown in FIG. 1). And return conductor 19 connects the end of cylindrical conductor 15 (shown in FIG. 2) to the end of cylindrical conductor 16 (shown in FIG. 1).

As a result of the foregoing interconnections, a current I, entering the end of conductor 13 shown in FIG. 1 follows the path indicated by the arrows labelled with an I. The current I, as can be seen from the Figures, passes through all the cylindrical conductors 13, 14, 15 and 16 in the same direction (i.e., generally from left to right) and emerges from gate winding 11 at terminal 20 (FIG. 2) which is connected to conductor 16.

Magnetic amplifiers and their operation are well known in the prior art, so this will not be discussed in any detail. The formula giving the relationship between the voltage rating of a magnetic amplifier and certain amplifier parameters is as follows:

Voltage rating = $2 N_g \text{ht} B_{max} 10^{-8} K$ where $N_g$ = number of turns in gate winding $h$ = core height $t$ = core thickness $B_{max}$ = maximum flux density to which core is designed to operate.

$K$ = constant (depends upon rectifier circuit configuration in which magnetic amplifier is to be used.)

Consequently, it is readily apparent from the formula for gate voltage that, for a given core size in a given rectifier circuit configuration, $h$, $t$, $B_{max}$ and K are fixed. Therefore the gate voltage varies directly as $N_g$. Consequently, the only way to increase the voltage rating of a magnetic amplifier is to increase the number of gate turns (i.e., increase $N_g$).

FIGS. 1 and 2 depict a magnetic amplifier wherein $N_g$ is 4. Various numbers of gate turn windings can be employed, depending upon the design criterion. The only limitation on the number of gate turns (i.e., $N_g$) is the practical limitation imposed by the sizes of the cylindrical conductors and the current carrying capacities thereof.

A magnetic amplifier constructed according to the principles of this disclosure has the advantage that the magnetic forces interacting between the cylindrical windings force them to be self centring. As a result, the mechanical bus support system is not required to be capable of withstanding the large forces normally associated with high overloads or faults. Insulating spacers (not shown) are employed to keep the cylindrical conductors 13, 14, 15 and 16 from touching one another and from touching the core 21.

The foregoing has been a description of the preferred embodiment of the present invention, as envisioned by the inventor. It is to be understood that the device depicted and described in this specification is for one specific application of the invention only, and variations can be made therefrom depending upon the particular application. Accordingly, the device described herein should not be considered as a limitation of the invention in any manner whatsoever, but rather, considered solely as an example for illustrative purposes.

The embdiments of the invention in which an exclusive property or privilege is claimed are defined as follows:

1. A magnetic amplifier comprising:
   (a) a hollow cylindrical saturable core of magnetic material,
   (b) a gate winding linked to said core and comprising a plurality of co-axial conductors passing longitudinally through said core and insulated therefrom, said co-axial conductors being interconnected, externally of said core, in such a manner that said co-axial conductors form a series circuit such that the currents passing through said co-axial conductors flow in the same direction in all said co-axial conductors,
   (c) and a control winding linked to said core and adapted to be energized from a source of adjustable DC voltage that provides an adjustable magnetomotive force level bias in said core for controlling the firing angle of the core and thus the average current through said gate winding.

2. The magnetic amplifier of claim 1 wherein said co-axial conductors comprise: a cylindrical shaped first conductor situated inside said core; the longitudinal axis of said first conductor coincident with the longitudinal axis of said core, and the ends of said first conductor protruding beyond the ends of said core; at least one hollow, cylindrical shaped second conductor positioned in a co-axial arrangement with said first conductor such that said first conductor is located inside said second conductor and spaced therefrom; the ends of said second conductor protrude beyond the ends of said core and the ends of said first conductor protrude beyond the ends of said second conductor.

3. The magnetic amplifier of claim 2 further including return conductors which interconnect the ends of said co-axial conductors to form said gate winding.

4. The magnetic amplifier of claim 3 wherein said gate winding comprises four co-axial conductors.

5. The magnetic amplifier of claim 2 wherein said gate winding comprises four co-axial conductors.

6. The magnetic amplifier of claim 1 wherein said gate winding comprises four co-axial conductors.

7. The magnetic amplifier of claim 1 in which said co-axial conductors are interconnected by return conductors externally of said core.

8. The magnetic amplifier of claim 7 wherein said gate winding has four co-axial conductors.

9. The magnetic amplifier of claim 7 wherein said co-axial conductors comprise: a solid cylindrical shaped conductor situated inside said core; the longitudinal axis of said solid conductor coincident with the longitudinal axis of said core, and the ends of said solid conductor protruding beyond the ends of said core; a plurality of hollow, cylindrical shaped conductors positioned in co-axial arrangement with said solid conductor such that said solid conductor is located inside said hollow conductors and spaced therefrom; the ends of said hollow conductors protrude beyond the ends of said core and the ends of said solid conductor protrude beyond the ends of said hollow conductors.

10. The magnetic amplifier of claim 9 wherein there are three said hollow, cylindrical shaped conductors.

* * * * *